United States Patent [19]
Kragl et al.

[11] Patent Number: 5,454,055
[45] Date of Patent: Sep. 26, 1995

[54] METHOD OF MAKING A COVER FOR AN INTEGRATED OPTICAL CIRCUIT, COVER FOR AN INTEGRATED OPTICAL CIRCUIT, AND INTEGRATED OPTICAL CIRCUIT MADE WITH THIS COVER

[75] Inventors: Hans Kragl, Ober-Ramstadt; Wolf-Henning Rech, Griesheim; Hergo H. Wehmann, Meine, all of Germany

[73] Assignee: Robert Bosch GmbH, Stuttgart, Germany

[21] Appl. No.: 240,743

[22] PCT Filed: Sep. 4, 1993

[86] PCT No.: PCT/DE93/00800

§ 371 Date: May 10, 1994

§ 102(e) Date: May 10, 1994

[87] PCT Pub. No.: WO94/08263

PCT Pub. Date: Apr. 14, 1994

[30] Foreign Application Priority Data

Sep. 29, 1992 [DE] Germany .................. 42 32 608.7

[51] Int. Cl.⁶ .................. G02B 6/12; B29D 11/00
[52] U.S. Cl. .................. 385/14; 385/88; 385/89; 385/92; 385/94; 385/90; 264/1.1; 264/1.24; 264/1.25
[58] Field of Search .................. 385/14, 15, 24, 385/31, 39, 49, 88, 89, 90, 91, 92, 94, 129, 130, 131, 132; 264/1.1, 1.24, 1.25, 1.29, 2.1, 2.2, 2.3, 1.37

[56] References Cited

U.S. PATENT DOCUMENTS

| | | | |
|---|---|---|---|
| 3,896,305 | 7/1975 | Ostrowsky | 385/14 X |
| 4,079,404 | 3/1978 | Comerford et al. | 385/14 X |
| 4,188,708 | 2/1980 | Frederiksen | 385/14 |
| 4,725,114 | 2/1988 | Murphy | 385/49 X |
| 4,904,036 | 2/1990 | Blonder | 385/14 X |
| 4,914,667 | 4/1990 | Blonder | 372/44 |
| 5,061,033 | 10/1991 | Richard | 385/92 |
| 5,165,002 | 11/1992 | Cumberledge et al. | 385/92 |
| 5,179,601 | 1/1993 | Gotoh et al. | 385/14 |
| 5,343,544 | 8/1994 | Boyd et al. | 385/46 |

FOREIGN PATENT DOCUMENTS

| | | | |
|---|---|---|---|
| 313956A3 | 5/1989 | European Pat. Off. | 385/14 X |
| 331338A2 | 9/1989 | European Pat. Off. | 385/14 X |
| 495559A1 | 7/1992 | European Pat. Off. | 385/14 X |
| 2226754 | 11/1974 | France | 385/49 X |
| 3345717A1 | 6/1985 | Germany | 385/14 X |
| 4212208A1 | 10/1993 | Germany | 385/14 X |
| 59-121008A | 7/1984 | Japan | 385/14 X |
| 60-49304A | 3/1985 | Japan | 385/14 X |

OTHER PUBLICATIONS

Y. Chan et al., "Channel Glass Waveguide Detectors with Grafted GaAs Film in Embedded Configuration," in *Electronics Letters*, vol. 27, No. 5, pp. 410–412 (Feb. 28, 1991).
"Silicon Optical Bench Research at AT&T Bell Laboratories", article by Greg E. Blonder, vol. 2, LEOS '90, IEEE Laser and Electro–Optics Society, Annual Meeting Conference Proceedings. (No month).

*Primary Examiner*—Brian Healy
*Attorney, Agent, or Firm*—Frishauf, Holtz, Goodman, Langer & Chick

[57] ABSTRACT

A method for making a cover for an integrated optical circuit, a cover for an integrated optical circuit, and an integrated optical circuit made with this cover are proposed. The method serves to minimize the effort and expense in integrating optical components in fiberoptical systems. An optical element 29 is placed in a molding die (10) with adjusting elements (13) that adjust the optical component (29) in its position, and a curable liquid is cast all around the optical component (29), and after it solidifies, this liquid forms the cover (25).

11 Claims, 4 Drawing Sheets

METHOD OF MAKING A COVER FOR AN INTEGRATED OPTICAL CIRCUIT, COVER FOR AN INTEGRATED OPTICAL CIRCUIT, AND INTEGRATED OPTICAL CIRCUIT MADE WITH THIS COVER

BACKGROUND OF THE INVENTION

The invention relates generally to a method for making a cover for an integrated optical circuit.

German Patent Application DE-P 42 12 208.2, MAYER/ BOSCH, has already disclosed a method for making optical polymer components with integrated fiber-chip coupling by a duplicate molding technique. To couple an integrated optical circuit in between two glass fibers, a polymer substrate is formed by means of a master structure such that the glass fibers come to rest in a V-shaped groove in the substrate. Their longitudinal axis is aligned with the longitudinal axis of a wave guide trench located in the substrate between the V-shaped grooves. By filling the grooves and the wave guide trench with polymer adhesive, both a mechanically firm bond between the substrate and the cover and an optical coupling of the glass fibers to the wave guide formed of the polymer adhesive are assured, once a polymer cover is put in place.

The article entitled "Channel glass wave guide detectors with grafted GaAs film in embedded configuration", in Electronic Letters 27 (1991), pp. 410–412, by Yi-Yan Chan et al, discloses the evanescent coupling of a photodetector, grafted onto a glass substrate, to a wave guide located in the substrate. This production process requires precise adjustment of the wave guide and photo detector relative to one another, which must be carried out individually for each component and involves a complicated adjustment process.

SUMMARY OF THE INVENTION

The method according to the invention has the advantage over the prior art that a cover for an integrated optical circuit can be made with extremely little effort for adjustment. There is also the advantage that the method of the invention is especially suitable for mass production, since the adjustment principle is automatable, and a plurality of covers for integrated optical circuits can be made simultaneously, and a plurality of integrated optical circuits can also be made together in one cover all at once.

Forming the adjustment elements and the optical component with partly oblique side faces is especially advantageous; as a result, even if slight maladjustments occur, the optical component is automatically adjusted laterally by gravity. Another advantageous feature is the provision of further adjustment elements that likewise automatically serve to provide vertical adjustment of the optical component.

Protrusions that leave behind a Bragg structure in the cover bring the advantage that Bragg structures are jointly made at the same time the cover is made. Contacting of the chip contacts by recesses created in the production process according to the invention advantageously economizes on one additional method step. Using a support plate not only facilitates manipulation of the optical component but also permits simultaneous production of a plurality of systems of the same type. Using a supplementary plate advantageously increases the mechanical stability of the entire arrangement.

The cover according to the invention is in particular produced by the method of the invention. V-shaped grooves facilitate the coupling of glass fibers to a system that includes the cover. The production process is especially suitable for integrating both integrated photodetectors and thermal actuators, because in that case, especially exact adjustment is required, which is achieved with especially little effort and expense by the method of the invention.

The cover of the invention is especially suitable for use in an integrated optical circuit, and the wave guide is advantageously formed when the cover is joined to a substrate by means of the adhesive, which fills a groove in the substrate.

DRAWING

Exemplary embodiments of the invention are shown in the drawing and described in further detail in the following description. Shown are:

FIG. 1, a perspective, cutaway view of an integrated optical circuit with a substrate, cover and glass fibers;

FIG. 2, a perspective view of the molding die and of the photodetector to be placed in it;

FIG. 3, a cross section through the molding die with the photodetector in place, the photodetector being wider than the spacing of the adjusting elements;

FIG. 4, a cross section through the molding die with the photodetector in place, the photodetector being narrower than the spacing of the adjusting elements;

FIG. 5, a cross section through an integrated optical circuit having a substrate and the cover in place, along with the photodetector and a supplementary plate;

FIG. 6, a plan view from below on the thermal actuator;

FIG. 7, a cross section through an integrated optical circuit having a substrate and the cover in place, along with a thermal actuator;

FIG. 8, a perspective view of the molding die for making the cover with the thermal actuator.

DETAILED DESCRIPTION OF THE EXEMPLARY EMBODIMENTS

Figure 1:
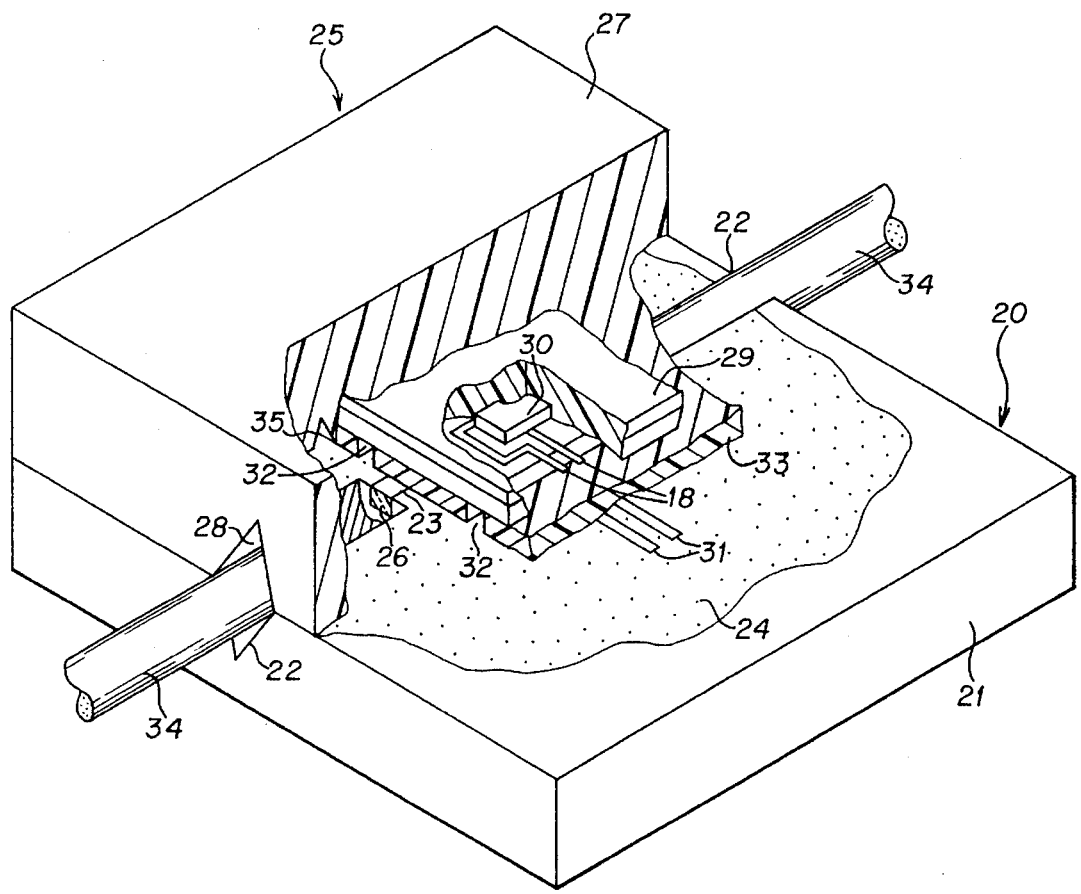

FIG. 1 shows a perspective cutaway view of an integrated optical circuit with a substrate 20, a cover 25, and glass fibers 34. The substrate 20 preferably comprises a polymer (such as Plexiglass) and includes a bottom plate 21 that has two V-shaped grooves 22 aligned with one another and one groove 23 of rectangular cross section, located between the V-shaped grooves 22 with its longitudinal axis likewise aligned with the longitudinal axis of the V-shaped grooves 22. The substrate 20 is joined to the cover 25 by means of an optically transparent adhesive 24. The adhesive 24 is preferably also a polymer. The adhesive 24 fills the groove 23 as well, and thus forms a wave guide 26. The cover 25 includes a cover plate 27, which has two further V-shaped grooves 28 on its underside, which once the cover 25 has been glued on come to rest precisely above the V-shaped grooves 22 of the substrate 20. An optical component 29 is also mounted in the cover plate 27. By way of example, the optical component 29 may be assumed to be a photodetector, which has an absorption zone 30 on its underside. The photodetector 29 is separated from the substrate 20 only by a thin fragmentary layer portion 33 of the cover plate 27, and once the cover 27 has been glued on it comes to rest with the absorption zone 30 directly above the wave guide 26. Two connecting lines 31 extend between the substrate 20 and the cover 25 and continue in the form of two block-shaped recesses 32, which are located in the layer portion 33 under the photodetector 29 parallel to the wave guide 26 and equidistant from it to the right and left, respectively; there, the recesses are conductively joined to two electrical contacts 18. The electrical contacts 18 extend between the layer portion 33 and the photodetector 29 as far as the absorption zone 30, where they serve to provide contacting of the absorption zone 30. A glass fiber 34 is introduced into each of the V-shaped grooves 22 and 28, each from one side. On its underside, the cover 25 also has four indentations 35, whose shape is the complement to a gable shape, and which are likewise filled with the adhesive 24 and are each located on one corner of the photodetector 29.

In this arrangement, the photodetector 29 is evanescently coupled to the wave guide 26. Light traveling through the glass fibers 34 continues on its way through the wave guide 26 and again reaches the glass fibers 34, which continue onward. The wave guide 26, which is formed of the adhesive 24, has an index of refraction which is higher than that of the materials for the cover plate 27 and the bottom plate 21 and which should be as nearly equal to the index of refraction of the glass fibers 34 as possible, in order to keep optical losses slight. The photodetector 29 is suitable for detecting light in the wave guide 26 and outputting a resultant detection signal to the connecting lines 31. The photodetector 29 is therefore positioned such that the absorption zone 30 comes to rest precisely above the wave guide 26. This requires precise adjustment of the arrangement when it is assembled. The method of the invention attains this object by means of a self-adjusting production process for the cover 25. To that end, for incorporation into the cover 25, the photodetector 29 is adjusted via a molding die 10 (see FIG. 2). The making of the cover 25, with the photodetector 29 integrated with it, is done by casting a curable liquid into the arrangement comprising the molding die 10 and the photodetector 29. This curable liquid is a liquid polymer, by way of example. After the curing, the molding die 10 is removed.

Figure 2:
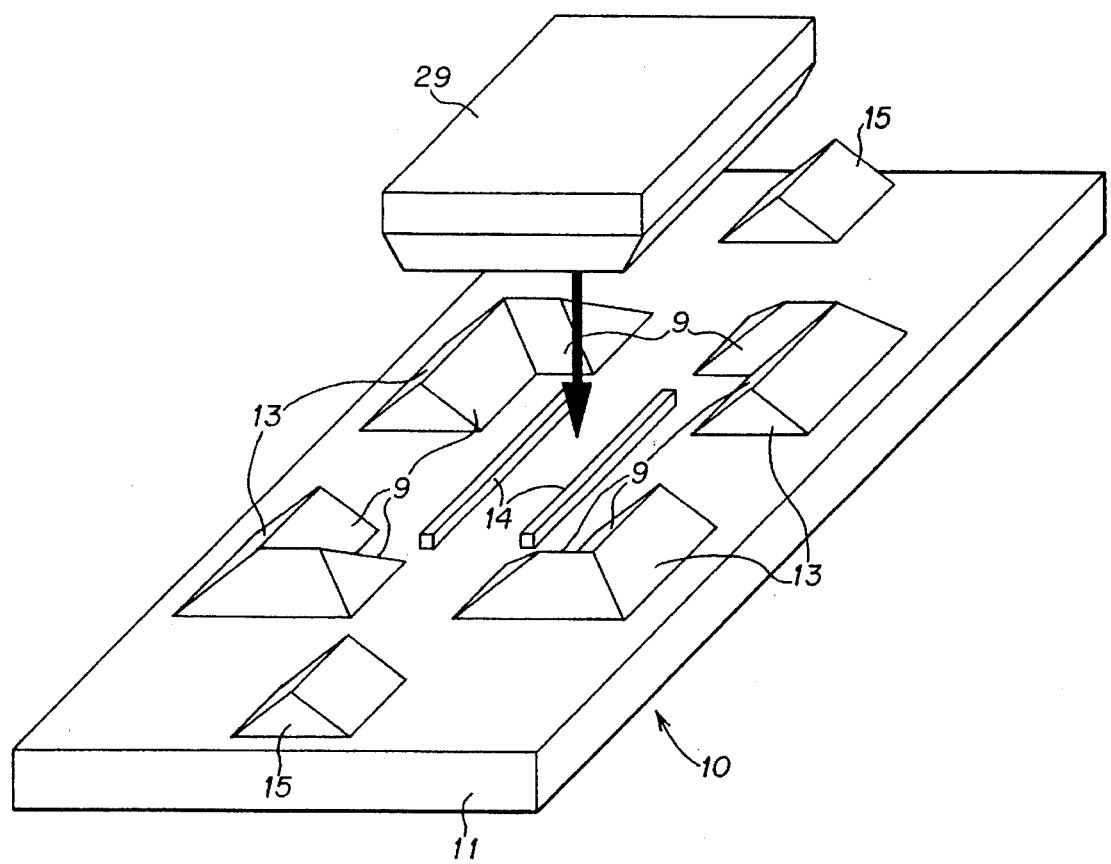

In FIG. 2, the molding die 10 for making the cover 25 is shown. It includes a base plate 11, on which two gable-shaped protrusions 15 and four adjusting elements 13, in the form of gable-shaped protrusions are attached, which accordingly have oblique side faces 9. The four adjusting elements 13 form the four corners of a rectangle, while the gable-shaped protrusions 15 are aligned with one another by their ridge line and intersect the ridge line of the rectangle in the middle; the gable-shaped protrusions 15 are each located on one end outside the rectangle. Parallel to the ridge line, the molding die 10 also has two further, block-shaped adjusting elements 14, which are located inside the rectangle, respectively to the left and right equidistant from the ridge line, and which has the function of spacer strips.

The adjusting elements 13 provide lateral centering and receive the photodetector 29, whose underside thus comes to rest on the block-shaped further adjusting elements 14, as a result of which the photodetector 29 is vertically adjusted. Ideally, the molding die 10 is made of nickel in a galvanic process.

Figure 3:
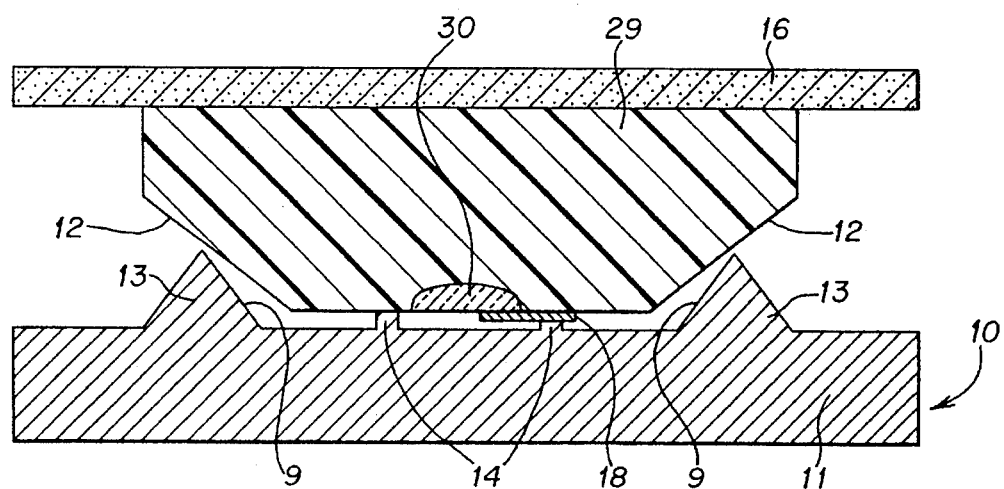
Figure 4:
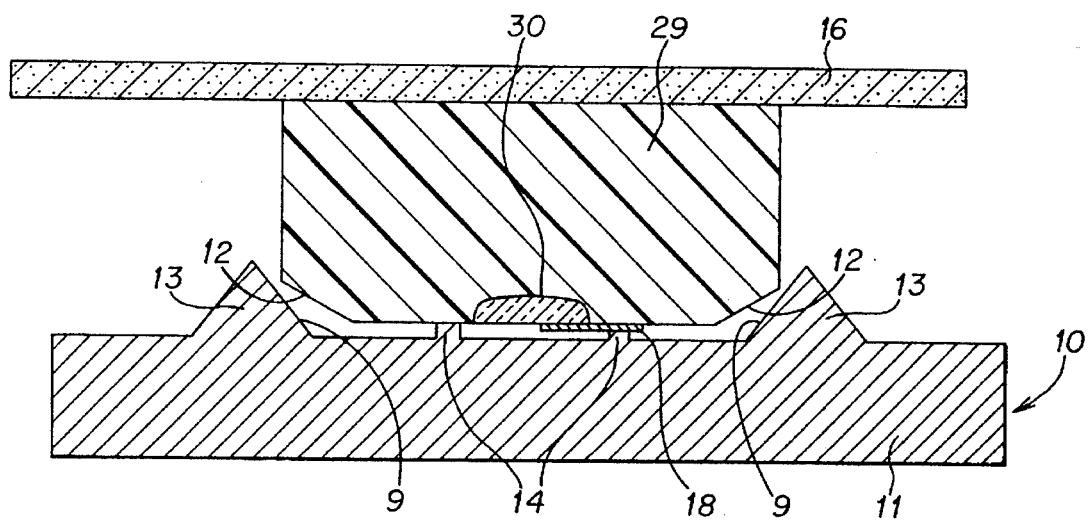

FIG. 3 and FIG. 4 each show a cross section through an arrangement of the molding die 10 and the photodetector 29, in place, in the method according to the invention for making the cover 25. The photodetector 29 is secured by its top to a support plate 16. For the selection of the support plate material, copper, silicon, Teflon or ceramic is suitable, for instance. The photodetector 29 is partly beveled downward on all four sides; that is, the photodetector 29 has four further oblique side faces 12, hereinafter called chamfers. The slope of the chamfers 12 is less than that of the oblique side faces 9 of the adjusting elements 13. Depending on the dimensions of the chamfers 12 and adjusting elements 13, the photodetector 29 comes to rest in different ways on the molding die 10: if the chamfers 12 are higher than the adjusting elements 13, then the adjusting elements 13, with their ridge lines, touch the chamfers 12 along their sides, as shown in FIG. 3. If the chamfers 12 are lower than the adjusting elements 13, then the adjusting elements 13 touch the upper boundary edges of the chamfers 12 with their oblique side faces 9 oriented toward the photodetector 29, as shown in FIG. 4. In each case, the photodetector 29 is dimensioned such that it sits with its underside on the block shaped further adjusting elements 14.

If the photodetector is made of indium phosphide or gallium arsenide, for instance, then an etching processing may be used to produce the chamfers 12 parallel to the wave guide 26, in which, with a surface alignment of the detector crystal in the (100) direction, for instance, etching is done with an HCl solution in the (011) direction, which produces highly precise chamfers 12. The chamfers 12 at right angles to the wave guide 26 may either be etched as well, or produced with a wafer saw; both of these processes produce less-accurate chamfers 12, since the process is not done in the (011) direction, although this has an effect in the adjustment process only longitudinally of the wave guide and is thus tolerable. V-grooves and thus the chamfers 12 as well can be etched in all directions in the case of photodetectors made of silicon. After the positioning of the photodetector 29 in the molding die 10, the liquid polymer is cast onto the arrangement and fills all the voids in the arrangement. The liquid polymer then cures into a rigid structure that forms the cover 25. It is especially suitable to make the further adjusting elements in multiple parts, in order to reinforce the casting process.

The method for producing the cover 25 can be done in two ways:

1. After the photodetector 29 is secured to the support plate 16, the support plate 16 is placed in a liquid-polymer filled tub with the side on which the photodetector 29 is secured facing upward, and then the molding die 10, likewise wetted with liquid polymer, is placed, roughly preadjusted, in the tub in such a way that the adjusting elements 13 automatically carry out the intended adjusting process. After the curing time, during which a contact pressure is employed, the molding die 10 is removed from the arrangement again. The support plate 16 can also be removed.

2. Alternatively, the molding die 10 may act as the bottom of a tub, and the photodetector 25 can be lowered onto it. Then the liquid polymer is introduced, and the curing time is allowed to elapse before the arrangement is unmolded.

The block-shaped further adjusting elements 14 then leave behind the block-shaped recesses 32 in the cover 25. The block-shaped recesses 32 from the block-shaped further adjusting elements 14 serve in the next method step to provide the connecting lines 31, in the form of contact holes for contacting the electrical contacts 18 of the photodetector 29. For that purpose, it is favorable to make the edges of the block-shaped further adjusting elements 14 oblique, in order to assure a secure electrical contact when the connecting line material is provided. The provision of the connecting lines 31 after unmolding of the cover 25 is suitably done by a photolithographic etching process with ensuing metal coating, such as sputtering. After the unmolding, the gable-shaped protrusions 15 leave behind the further V-shaped grooves 28 in the cover plate 27, which when the integrated optical circuit is assembled serve to receive and adjust the glass fibers 34 that are to be put in place. Once the cover 25 has been made, then to assemble the integrated optical circuit, the cover 25 is glued to the substrate 20 by means of the adhesive 24; at the same time, the glass fibers 34 are placed in the intended V-shaped grooves 22, 28 and secured mechanically and optically, likewise by means of the adhesive 24, to the arrangement comprising the cover 25 and substrate 20. The indentations 35 of complementary shape to a gable that are left behind in the cover plate 27 in the molding process, in the form of the inverse adjusting elements 13, are filled with the adhesive 24 when the cover 25 and substrate 20 are joined together for the integrated optical circuit, and have no further function. The block-shaped recesses 32, left behind in the cover plate 27 after unmolding by the block-shaped further adjusting elements 14, by means of which recesses the electrical contacts 18 are joined to the connecting lines 31 in the next method step, are filled with the adhesive 24 in the ensuing gluing, which serves to assemble the integrated optical circuit.

Figure 5:
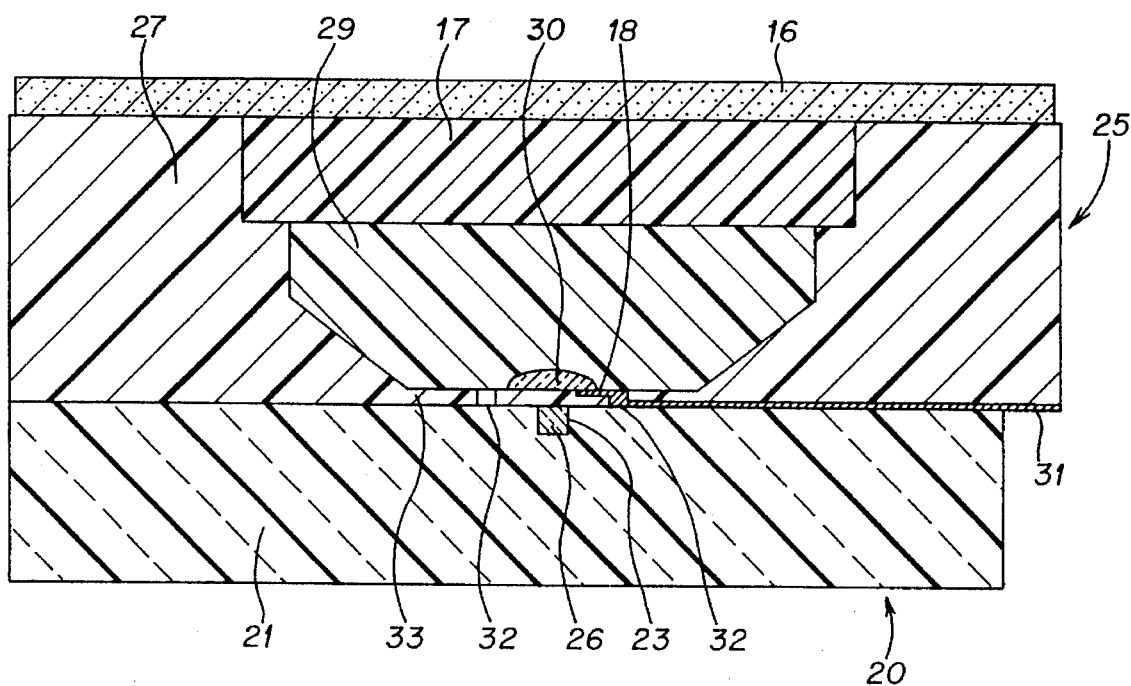

FIG. 5 shows a cross section through the integrated optical circuit with the cover 25 on the substrate 20, using a supplementary plate 17. The cover 25 is glued to the substrate 20, which includes the wave guide 26. The cover includes the photodetector 29, which is embedded in the cover plate 27 and is joined on its top to the complementary plate 17. The supplementary plate 17 is secured by its top to the support plate 16. The absorption zone 30 on the underside of the photodetector 29 is separated from the substrate 20 by the layer portion 33. The electrical contacts 18 are joined to the connecting lines 31, which extend through the block-shaped recesses 32 that were created in the cover 25 by the block-shaped further adjusting elements 14. The connecting lines 31 extend onward to the outside between the cover 25 and the substrate 20. In this case, the support plate 16 was not removed from the arrangement after solidification of the liquid polymer. The supplementary plate 17 between the photodetector 29 and the support plate 16 is larger in its outside dimensions than the photodetector 29 and smaller than the support plate 16. The supplementary plate 17 serves to make the cover 25 thicker, which thereby becomes mechanically more stable.

For improved function, it is possible to metallize the underside of the photodetector 29 over as large an area as possible, in order to prevent the electromagnetic field carried in the wave guide 26 from penetrating the photodetector 29, which would mean increased wave guide losses. On the other hand, since the metallizing has a disruptive influence on the propagation of light in the wave guide 26, it is suitable to increase the spacing between the metallizing of the photodetector 29 and the wave guide 26. This can be done by increasing the height of the further adjusting elements 14. To compensate for the then-increased spacing between the absorption zone 30 and the wave guide 26 as well, it is suitable for the photodetector 29 to have a protrusion on the face of the underside, located between the further adjusting elements 14 and on which the absorption zone 30 is also located, which protrusion is preferably of the same material as the photodetector 29 and whose task is, because of its higher index of refraction, to improve the outcoupling of light from the wave guide 29 to the absorption zone 30.

As a further application, the integration of a further optical component 35 in the form of a thermal actuator is contemplated. Once again, adjustment of the thermal actuator 36 is already done by means of the molding die 10 in the production of the cover 25 into which the thermal actuator 36 is to be integrated. The layout of the substrate 20 and the arrangement of glass fibers 34 and of the wave guide 26 are therefore the same as described above.

Figure 6:
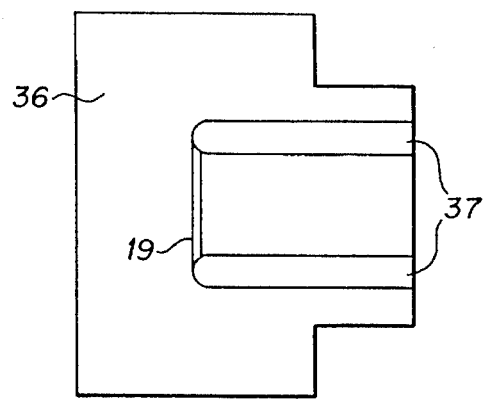

FIG. 6 shows a thermal actuator 36 with a hot wire 19 in a plan view from below. The hot wire 19 is secured to the underside of the thermal actuator 36, has two further electrical contacts 37 as terminals, and serves the purpose of thermal control of the thermally sensitive wave guide 26 formed of the adhesive 24.

Figure 7:
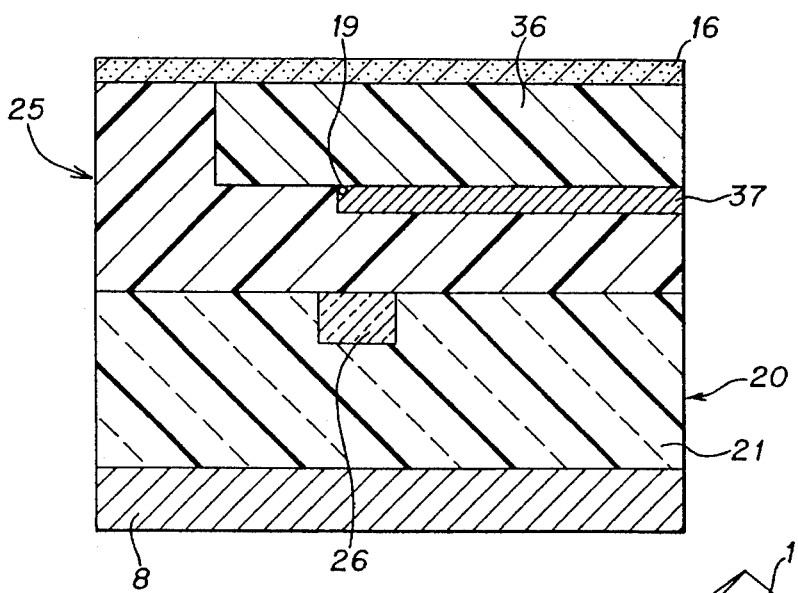

FIG. 7 shows a cross section through an arrangement comprising the substrate 20 and cover 25 with the thermal actuators 36 having the hot wire 19. The thermal actuator 36 is secured by its top to the support plate 16 and on its underside has the further electrical contacts 37 and the hot wire 19. Once the cover 25 is glued in place, the hot wire 19 comes to rest precisely above the wave guide 26. On the underside, the substrate 20 is joined to a cooling plate 8.

Current flowing through the hot wire 19 generates heat, and a result the hot wire 19 heats its immediate surroundings, and in particular the wave guide 26. The cooling plate 8, acting as a heat sink, is provided in order to dissipate the heat; it is thermally conductively secured to the underside of the substrate 20. It is equally possible to secure the cooling plate 8 thermally conductively to the top of the cover 25. By integrating the thermal actuator 36 into the course of the light carried by means of the glass fibers 34 and the wave guide 26, a light signal can be thermooptically varied in the wave guide 26, since the wave guide 26 has a temperature-dependent index of refraction.

Figure 8:
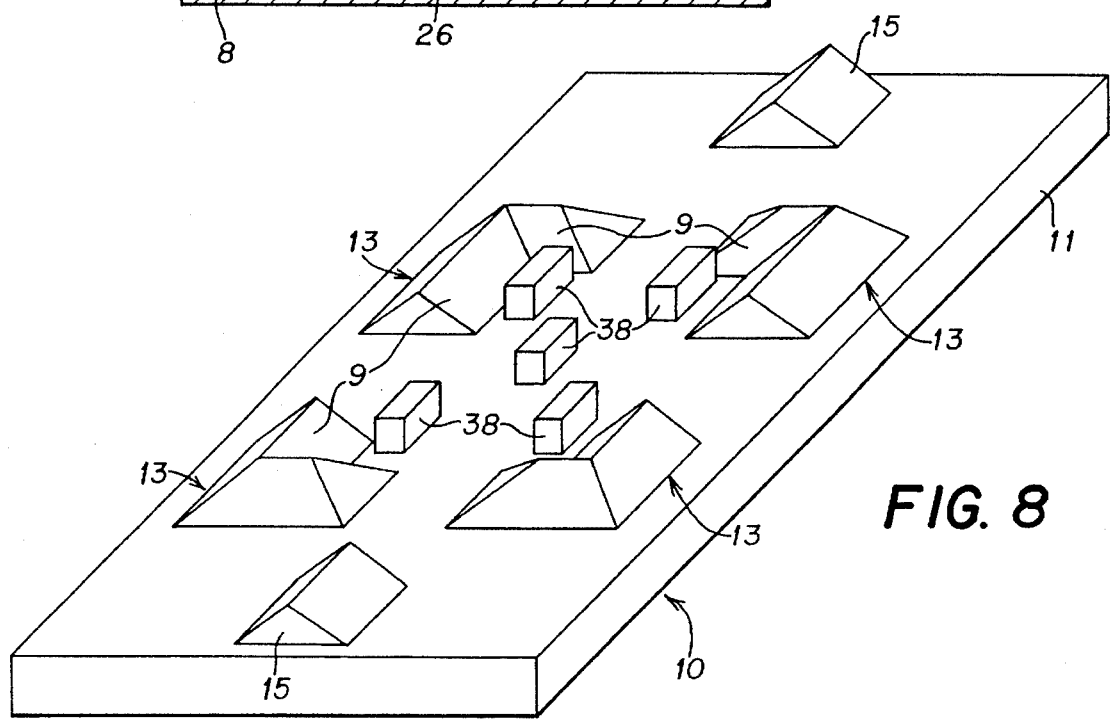

FIG. 8 is a perspective view of the molding die 10 for making the cover 25 with the thermal actuator 36 having the hot wire 19. The molding die 10 in FIG. 7 differs from the molding die 10 in FIG. 2 only in the arrangement and form of the block-shaped further adjusting elements 14. Here, instead of the block-shaped further adjusting elements 14, the molding die 10 has spacers 38, which are arranged in the pattern of the dots on the "B" side of dice on the surface of the base plate 11, inside the rectangle formed by the gable-shaped adjusting elements 13. When a thermal actuator with a hot wire 19 is integrated, the demands for exactness of adjustment of the hot wire 19 in the vertical direction are not so stringent, and it is therefore sufficient for the spacers to be simple glued-on sheet-metal disks, or galvanically grown protrusions.

We claim:

1. A method of making a cover for an integrated optical circuit, which has a substrate in which a wave guide is integrated, characterized in that the cover (25) includes an optical component (29), and that a molding die (10) is provided that has adjusting elements (13), which when the optical component (29) is placed on the molding die (10) determine the lateral position of the optical component (29), and that the cover (29) is made by casting a curable liquid all around the optical component (29).

2. The method of claim 1, characterized in that the adjusting elements (13) and the optical component (29) have at least partially oblique side faces (12, 9), which slide on one another when the optical component (29) is placed on the molding die (10).

3. The method of claim 1, characterized in that the molding die (10) has further adjusting elements (14), which reinforce the optical component (29) from below as it is put in place.

4. The method of claim 1, characterized in that the molding die (10) has molding elements that leave a Bragg structure behind in the cover (25).

5. The method of claim 3, characterized in that after unmolding of the molding die (10), electrically conductive material is applied to portions of the underside of the cover (25), and that the optical component (29) has electrical contacts (18), which are conductively joined to the electrically conductive material by means of recesses (32), created in the method step of the casting of the further adjusting elements (14), located on the molding die (10), using the curable liquid.

6. The method of claims 1, characterized in that the optical component (29), before being placed on the molding die (10), is secured by its top to a support plate (16).

7. The method of claim 6, characterized in that a supplementary plate (17) is located between the optical component (29) and the support plate (16).

8. A cover for an integrated optical circuit, characterized in that the cover (25) includes an optical component (29), and that the cover (25) has indentations (35) that are located all around the optical component (29), wherein the optical component (29) is an integrated thermal actuator.

9. The cover of claim 8, characterized in that the cover (25) has V-shaped grooves (28), which serve as guide elements for glass fibers (34).

10. The cover of claim 8, characterized in that the optical element (29) is a photodetector.

11. An integrated optical circuit having a cover, wherein the cover includes an optical component comprised of an integrated thermal actuator, V-shaped grooves (28), and indentations that are located all around the optical component, and wherein the integrated optical circuit includes a substrate (20), which has at least two V-shaped grooves (22) and one groove 23 located between the two V-shaped grooves (22), the cover (25) with the optical component (29) being secured to the substrate (20) by means of an optically transparent adhesive (24), wherein the optically transparent adhesive (24) simultaneously fills the groove (23), thereby forming a wave guide (26), and the V-shaped grooves (28) of the cover (25) being located above the V-shaped grooves (22) of the substrate (20).

* * * * *